United States Patent
Hays et al.

(10) Patent No.: US 8,797,197 B2
(45) Date of Patent: Aug. 5, 2014

(54) ANALOG-TO-DIGITAL CONVERSION STAGE AND PHASE SYNCHRONIZATION METHOD FOR DIGITIZING TWO OR MORE ANALOG SIGNALS

(75) Inventors: Paul J. Hays, Lafayette, CO (US); Craig B. McAnally, Thornton, CO (US)

(73) Assignee: Micro Motion, Inc., Boulder, CO (US)

(*) Notice: Subject to any disclaimer, the term of this patent is extended or adjusted under 35 U.S.C. 154(b) by 0 days.

(21) Appl. No.: 13/814,351

(22) PCT Filed: Aug. 27, 2010

(86) PCT No.: PCT/US2010/046914
§ 371 (c)(1),
(2), (4) Date: Feb. 5, 2013

(87) PCT Pub. No.: WO2012/026941
PCT Pub. Date: Mar. 1, 2012

(65) Prior Publication Data
US 2013/0141262 A1 Jun. 6, 2013

(51) Int. Cl.
*H03M 1/06* (2006.01)
(52) U.S. Cl.
USPC .......................... 341/118; 341/155
(58) Field of Classification Search
CPC ........................................................ G01F 1/84
USPC .......... 341/155, 118; 702/89, 45; 73/861.356, 73/861.357, 861.355
See application file for complete search history.

(56) References Cited

U.S. PATENT DOCUMENTS

| 4,817,448 A | 4/1989 | Hargarten et al. |
| 5,469,748 A | 11/1995 | Kalotay |
| 6,073,495 A * | 6/2000 | Stadler ...................... 73/861.356 |
| 6,606,572 B2 * | 8/2003 | Hansen et al. .................. 702/45 |
| 6,799,476 B2 * | 10/2004 | Brockhaus ............... 73/861.356 |
| 7,469,600 B2 | 12/2008 | Matt et al. |
| 7,555,397 B2 * | 6/2009 | Roost et al. ..................... 702/89 |

FOREIGN PATENT DOCUMENTS

| DE | 102004055553 A1 | 5/2006 |
| JP | 2011137771 | 7/2011 |

* cited by examiner

*Primary Examiner* — Jean B Jeanglaude
(74) *Attorney, Agent, or Firm* — The Ollila Law Group LLC (57) ABSTRACT

An analog-to-digital conversion stage (300) includes three or more ADCs (303, 305, 307) that receive two or more analog signals, generate a first digitized signal from a first analog signal, generate at least a second digitized signal from at least a second analog signal to create two or more digitized signals, and generate one or more redundant digitized signals from the two or more analog signals. The one or more redundant digitized signals are generated substantially in parallel with the two or more digitized signals. A processing device (330) generates a phase drift value from a phase difference between a redundant digitized signal of the one or more redundant digitized signals and a corresponding digitized signal of the two or more digitized signals and compensates the corresponding digitized signal using the one or more phase drift values.

12 Claims, 10 Drawing Sheets

ANALOG-TO-DIGITAL CONVERSION STAGE AND PHASE SYNCHRONIZATION METHOD FOR DIGITIZING TWO OR MORE ANALOG SIGNALS

BACKGROUND OF THE INVENTION

1. Field of the Invention

The present invention relates to analog-to-digital converters (ADCs), and more particularly, to phase synchronization between multiple ADCs.

2. Statement of the Problem

Vibrating conduit sensors, such as Coriolis mass flowmeters and vibrating densitometers, typically operate by detecting motion of a vibrating conduit that contains a flowing material. Properties associated with the material in the conduit, such as mass flow, density and the like, can be determined by processing measurement signals received from motion transducers associated with the conduit. The vibration modes of the vibrating material-filled system generally are affected by the combined mass, stiffness and damping characteristics of the containing conduit and the material contained therein.

A typical Coriolis mass flowmeter includes one or more conduits that are connected inline in a pipeline or other transport system and convey material, e.g., fluids, slurries, emulsions, and the like, in the system. Each conduit may be viewed as having a set of natural vibration modes, including for example, simple bending, torsional, radial, and coupled modes. In a typical Coriolis mass flow measurement application, a conduit is excited in one or more vibration modes as a material flows through the conduit, and motion of the conduit is measured at points spaced along the conduit. Excitation is typically provided by an actuator, e.g., an electromechanical device, such as a voice coil-type driver, that perturbs the conduit in a periodic fashion. Mass flow rate may be determined by measuring time delay or phase differences between motions at the transducer locations.

Two such transducers (or pickoff sensors) are typically employed in order to measure a vibrational response of the flow conduit or conduits, and are typically located at positions upstream and downstream of the actuator. The two pickoff sensors are connected to electronic instrumentation. The instrumentation receives signals from the two pickoff sensors and processes the signals in order to derive a mass flow rate measurement, among other things.

The pickoff signals typically comprise time-varying analog signals that are generated by the vibrations as picked up by pickoff sensor coils. The analog pickoff signals are subsequently converted into digital signals for processing.

Figure 1:
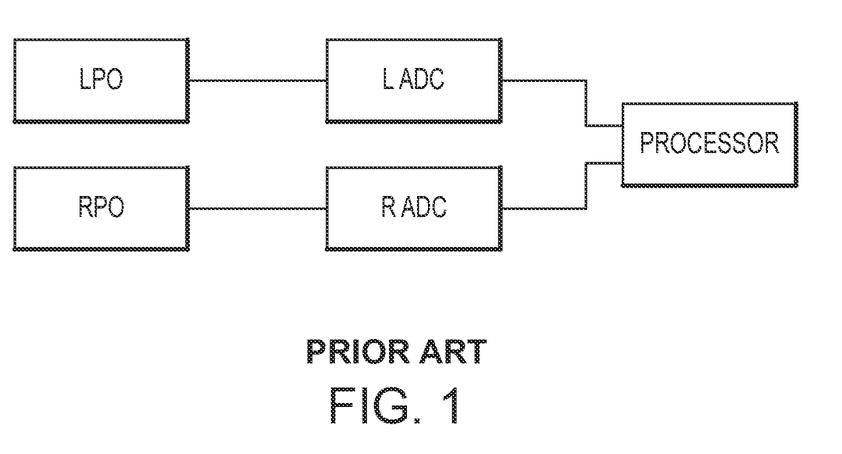
FIG. 1 shows a prior art analog-to-digital converter (ADC) arrangement for a Coriolis flow meter.

FIG. 1 shows a prior art analog-to-digital converter (ADC) arrangement for a Coriolis flow meter. The left pickoff signal generated by the left pickoff (LPO) is fed into a first ADC and the right pickoff signal generated by the right pickoff (RPO) sensor is fed into a second ADC. Each ADC digitizes a respective analog signal and outputs a corresponding digitized pickoff signal to a processor or other circuitry for further processing. For example, a processing can comprise determining a phase difference between the pickoff sensor signals due to the Coriolis effect. A phase difference can be used to determine a mass flow rate through the meter.

It is obvious that any phase differences introduced by the two ADCs will be seen by the processor and will negatively affect a mass flow rate measurement. The phase drift performance of an ADC is inherent in its design. The phase drift of an ADC can be affected by input signal amplitude changes, power supply voltage changes, EMC effects, temperature changes, input frequency changes, noise content, harmonic content, or other reasons.

Commercially and readily available is a component called a codec, comprising a combination coder-decoder. A codec contains two ADCs on the same silicon die, along with digital-to-analog converters (DACs), with these components typically being designed to work in the audio range (i.e., at frequencies up to about 20,000 Hz). It is difficult to find a suitable codec for dual channel analog-to-digital conversion where phase difference is important, as different manufacturers have different construction processes which can result in very different phase performance. Additionally, codecs are designed to work in the audio world, where small phase differences are acceptable. Therefore, commercially available codecs do not have any phase specifications available for use in Coriolis flow meter design. Further, since the phase drift is not specified, manufacturer can change the phase drift performance at any point. This puts a user in the position of having to keep checking the phase drift performance.

ASPECTS OF THE INVENTION

In one aspect of the invention, an analog-to-digital conversion (ADC) stage for digitizing two or more analog signals comprises:

three or more ADCs configured to receive the two or more analog signals, generate a first digitized signal from a first analog signal of the two or more analog signals, generate at least a second digitized signal from at least a second analog signal of the two or more analog signals to create two or more digitized signals, and generate one or more redundant digitized signals from the two or more analog signals, with the one or more redundant digitized signals being generated substantially in parallel with the two or more digitized signals;

a processing device coupled to the three or more ADCs, with the processing device configured to generate a phase drift value from a phase difference between a redundant digitized signal of the one or more redundant digitized signals and a corresponding digitized signal of the two or more digitized signals and compensate the corresponding digitized signal using the one or more phase drift values.

Preferably, the phase drift value is generated substantially concurrently with the two or more digitized signals.

Preferably, two or more phase drift values are generated substantially concurrently with the two or more digitized signals.

Preferably, the two or more analog signals comprise a left analog pickoff signal and a right analog pickoff signal generated by a vibratory flow meter.

Preferably, the two or more analog signals comprise a left analog pickoff signal and a right analog pickoff signal generated by a vibratory flow meter, with the processing device using the two or more digitized signals and the phase drift value for determining one or more flow characteristics of a flow material.

Preferably, the two or more analog signals comprise a left analog pickoff signal and a right analog pickoff signal generated by a Coriolis mass flow meter, with the processing device using the two or more digitized signals and the drift value for determining one or more flow characteristics of a flow material.

Preferably, the one or more redundant digitized signals are generated from one or more fixed predetermined analog signals of the two or more analog signals.

Preferably, the one or more redundant digitized signals are cyclically generated from among the two or more analog signals.

Preferably, the two or more analog signals comprise a left analog pickoff signal and a right analog pickoff signal generated by a vibratory flow meter, with generating the one or more redundant digitized signals, generating the phase drift value, and compensating the corresponding digitized signal further comprise generating a redundant digitized left pickoff signal from the left analog pickoff signal, generating a redundant digitized right pickoff signal from the right analog pickoff signal, generating a left phase drift value from a left phase difference between the digitized left pickoff signal and the redundant digitized left pickoff signal, generating a right phase drift value from a right phase difference between the digitized right pickoff signal and the redundant digitized right pickoff signal, compensating the left digitized signal using the left phase drift value, and compensating the right digitized signal using the right phase drift value.

Preferably, the two or more analog signals comprise a left analog pickoff signal and a right analog pickoff signal generated by a vibratory flow meter, with generating the one or more redundant digitized signals, generating the phase drift value, and compensating the corresponding digitized signal further comprising generating a redundant digitized left pickoff signal from the left analog pickoff signal, generating a left phase drift value from a left phase difference between the digitized left pickoff signal and the redundant digitized left pickoff signal, compensating the left digitized signal using the left phase drift value, at a second time, generating a redundant digitized right pickoff signal from the right analog pickoff signal, at the second time, generating a right phase drift value from a right phase difference between the digitized right pickoff signal and the redundant digitized right pickoff signal, and at the second time, compensating the right digitized signal using the right phase drift value.

In one aspect of the invention, a phase synchronization method for digitizing two or more analog signals comprises:
generating a first digitized signal from a first analog signal of the two or more analog signals and generating at least a second digitized signal from at least a second analog signal of the two or more analog signals to create two or more digitized signals;
generating one or more redundant digitized signals from the two or more analog signals, with the one or more redundant digitized signals being generated substantially in parallel with the two or more digitized signals;
generating a phase drift value from a phase difference between a redundant digitized signal of the one or more redundant digitized signals and a corresponding digitized signal of the two or more digitized signals; and
compensating the corresponding digitized signal using the phase drift value.

Preferably, the phase drift value is generated substantially concurrently with the two or more digitized signals.

Preferably, two or more phase drift values are generated substantially concurrently with the two or more digitized signals.

Preferably, the two or more analog signals comprise a left analog pickoff signal and a right analog pickoff signal generated by a vibratory flow meter.

Preferably, the two or more analog signals comprise a left analog pickoff signal and a right analog pickoff signal generated by a vibratory flow meter, with the processing device using the two or more digitized signals and the phase drift value for determining one or more flow characteristics of a flow material.

Preferably, the two or more analog signals comprise a left analog pickoff signal and a right analog pickoff signal generated by a Coriolis mass flow meter, with the processing device using the two or more digitized signals and the drift value for determining one or more flow characteristics of a flow material.

Preferably, the one or more redundant digitized signals are generated from one or more fixed predetermined analog signals of the two or more analog signals.

Preferably, the one or more redundant digitized signals are cyclically generated from among the two or more analog signals.

Preferably, the two or more analog signals comprise a left analog pickoff signal and a right analog pickoff signal generated by a vibratory flow meter, with generating the one or more redundant digitized signals, generating the phase drift value, and compensating the corresponding digitized signal further comprise generating a redundant digitized left pickoff signal from the left analog pickoff signal, generating a redundant digitized right pickoff signal from the right analog pickoff signal, generating a left phase drift value from a left phase difference between the digitized left pickoff signal and the redundant digitized left pickoff signal, generating a right phase drift value from a right phase difference between the digitized right pickoff signal and the redundant digitized right pickoff signal, compensating the left digitized signal using the left phase drift value, and compensating the right digitized signal using the right phase drift value.

Preferably, the two or more analog signals comprise a left analog pickoff signal and a right analog pickoff signal generated by a vibratory flow meter, with generating the one or more redundant digitized signals, generating the phase drift value, and compensating the corresponding digitized signal further comprising generating a redundant digitized left pickoff signal from the left analog pickoff signal, generating a left phase drift value from a left phase difference between the digitized left pickoff signal and the redundant digitized left pickoff signal, compensating the left digitized signal using the left phase drift value, at a second time, generating a redundant digitized right pickoff signal from the right analog pickoff signal, at the second time, generating a right phase drift value from a right phase difference between the digitized right pickoff signal and the redundant digitized right pickoff signal, and at the second time, compensating the right digitized signal using the right phase drift value.

DETAILED DESCRIPTION OF THE INVENTION

FIGS. 1-10 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 2:
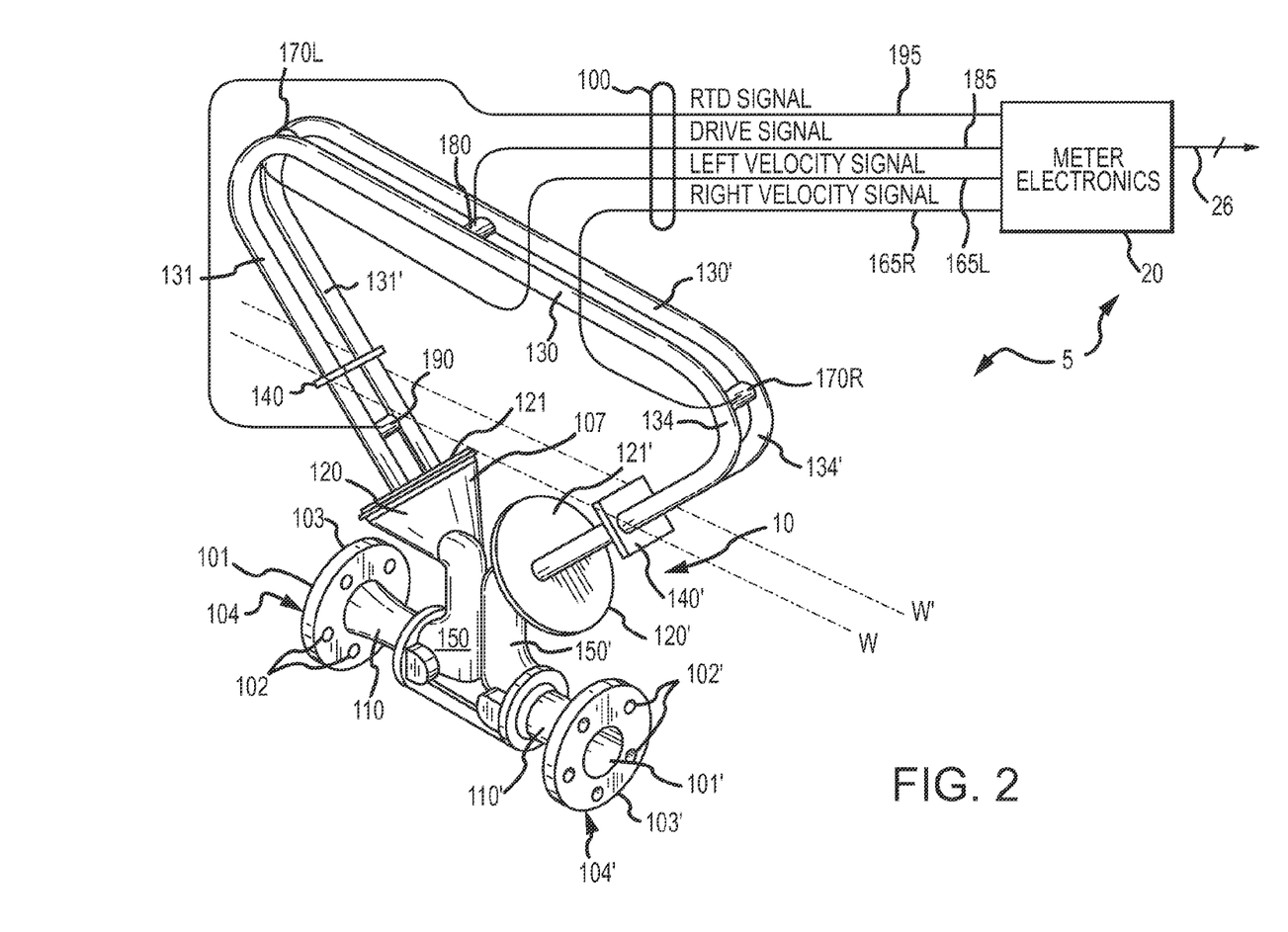
FIG. 2 shows a Coriolis flow meter comprising a meter assembly and meter electronics.

FIG. 2 shows a Coriolis flow meter 5 comprising a meter assembly 10 and meter electronics 20. Meter assembly 10 responds to mass flow rate and density of a process material. Meter electronics 20 is connected to meter assembly 10 via leads 100 to provide density, mass flow rate, and temperature information over path 26, as well as other information. A Coriolis flow meter structure is described, although it is apparent to those skilled in the art that the present invention could be practiced as a vibrating tube densitometer.

Meter assembly 10 includes a pair of manifolds 150 and 150', flanges 103 and 103' having flange necks 110 and 110', a pair of parallel flow tubes 130 and 130', drive mechanism 180, temperature sensor 190, and a pair of velocity (pickoff) sensors 170L and 170R. Flow tubes 130 and 130' have two essentially straight inlet legs 131 and 131' and outlet legs 134 and 134' which converge towards each other at flow tube mounting blocks 120 and 120'. Flow tubes 130 and 130' bend at two symmetrical locations along their length and are essentially parallel throughout their length. Brace bars 140 and 140' serve to define the axis W and W' about which each flow tube oscillates.

The side legs 131, 131' and 134, 134' of flow tubes 130 and 130' are fixedly attached to flow tube mounting blocks 120 and 120' and these blocks, in turn, are fixedly attached to manifolds 150 and 150'. This provides a continuous closed material path through Coriolis meter assembly 10.

When flanges 103 and 103' having holes 102 and 102' are connected, via inlet end 104 and outlet end 104' into a process line (not shown) which carries the process material that is being measured, material enters end 104 of the meter through an orifice 101 in flange 103 and is conducted through manifold 150 to flow tube mounting block 120 having a surface 121. Within manifold 150, the material is divided and routed through flow tubes 130 and 130'. Upon exiting flow tubes 130 and 130', the process material is recombined in a single stream within manifold 150' and is thereafter routed to exit end 104' connected by flange 103' to the process line.

Flow tubes 130 and 130' are selected and appropriately mounted to the flow tube mounting blocks 120 and 120' so as to have substantially the same mass distribution, moments of inertia and Young's modulus about bending axes W-W and W'-WW', respectively. These bending axes go through brace bars 140 and 140'. Inasmuch as the Young's modulus of the flow tubes change with temperature, and this change affects the calculation of flow and density, resistive temperature detector (RTD) 190 is mounted to flow tube 130' to continuously measure the temperature of the flow tube. The temperature of the flow tube, and hence the voltage appearing across the RTD for a given current passing therethrough, is governed by the temperature of the material passing through the flow tube. The temperature dependent voltage appearing across the RTD is used in a well known method by meter electronics 20 to compensate for the change in elastic modulus of flow tubes 130 and 130' due to any changes in flow tube temperature. The RTD is connected to meter electronics 20 by lead 195.

Both flow tubes 130 and 130' are driven by driver 180 in opposite directions about their respective bending axes W and W' at what is termed the first out-of-phase bending mode of the flow meter. This drive mechanism 180 may comprise any one of many well known arrangements, such as a magnet mounted to flow tube 130' and an opposing coil mounted to flow tube 130 and through which an alternating current is passed for vibrating both flow tubes. A suitable drive signal is applied by meter electronics 20, via lead 185, to drive mechanism 180.

Meter electronics 20 receives the RTD temperature signal on lead 195 and the left and right velocity signals appearing on leads 165L and 165R, respectively. Meter electronics 20 produces the drive signal appearing on lead 185 to drive element 180 and vibrate tubes 130 and 130'. Meter electronics 20 processes the left and right velocity signals and the RTD signal to compute the mass flow rate and/or the density of the material passing through meter assembly 10, among other things. This information, along with other information, is applied by meter electronics 20 over path 26.

Figure 3:
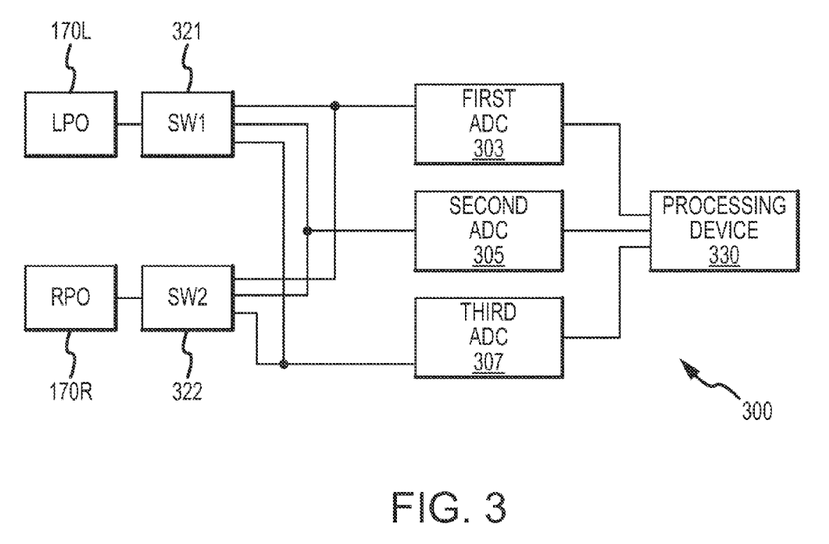
FIG. 3 shows an analog-to-digital conversion (ADC) stage according to an embodiment of the invention.

FIG. 3 shows an analog-to-digital conversion (ADC) stage 300 according to an embodiment of the invention. The ADC stage 300 can comprise a component of the meter electronics 20 in some embodiments. For example, the ADC stage 300 can receive multiple analog inputs, such as multiple analog pickoff sensor signals, and generate multiple digitized signals therefrom.

The ADC stage 300 in the embodiment shown comprises a first analog-to-digital converter (ADC) 303, a second ADC 305, and a third ADC 307. The three ADCs 303, 305, and 307 are coupled to a processing device 330. The processing device 330 can comprise a device capable of detecting a phase difference between digital signals and generating a phase drift (or phase difference) value therebetween. The processing device 330 can comprise a distinct component or can comprise a portion of another processor or device within the meter electronics 20. The processing device 330 can comprise any device or sub-device that can determine a phase difference between signals.

The three ADCs 303, 305, and 307 are coupled to the left pickoff (LPO) sensor 170L and to the right pickoff (RPO) sensor 170R using switches 321 and 322 in the embodiment shown. The switches 321 and 322 are operated to connect the LPO 170L and the RPO 170R to the three ADCs 303, 305, and 307.

The three or more ADCs 303, 305, 307 are configured to receive the two or more analog signals, generate a first digitized signal from a first analog signal of the two or more analog signals, generate at least a second digitized signal from at least a second analog signal of the two or more analog signals to create two or more digitized signals, and generate one or more redundant digitized signals from the two or more analog signals. The one or more redundant digitized signals are generated substantially in parallel with the two or more digitized signals. The processing device 330 is configured to generate a phase drift value from a phase difference between a redundant digitized signal of the one or more redundant digitized signals and a corresponding digitized signal of the two or more digitized signals. The processing device 330 is configured to compensate the corresponding digitized signal using the one or more phase drift values.

Figure 7:
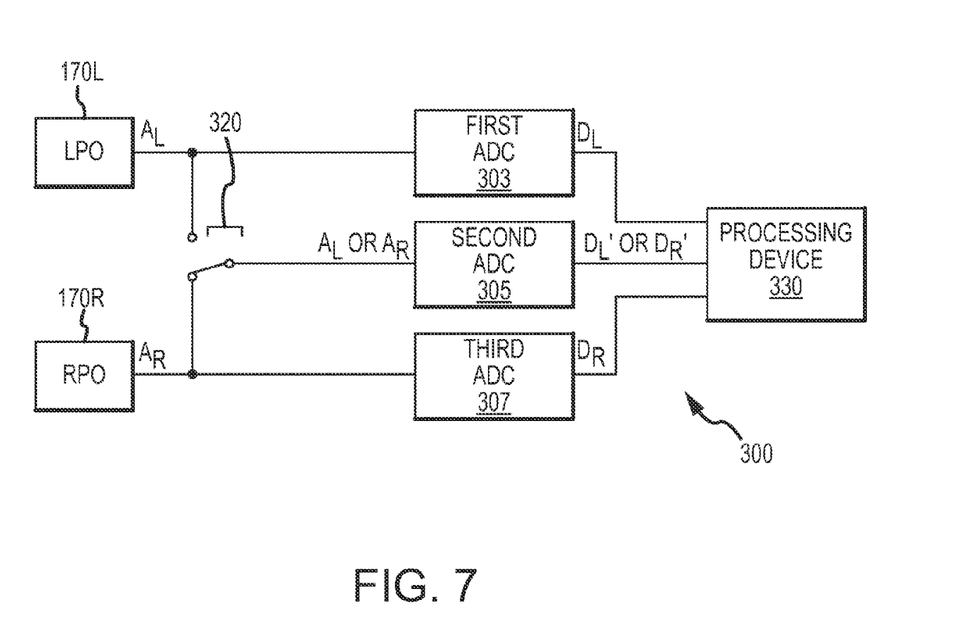
FIG. 7 shows the ADC stage according to another embodiment of the invention.
Figure 8:
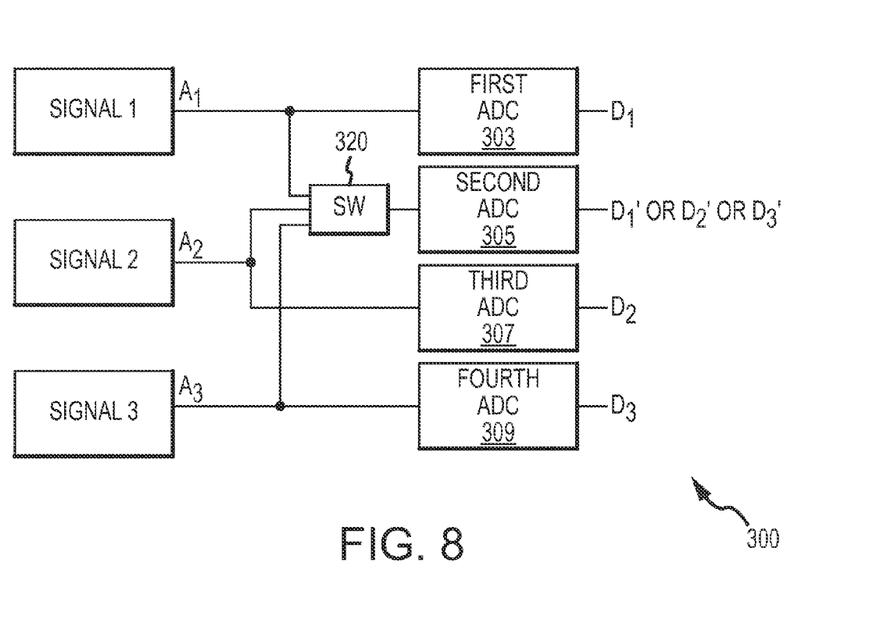
FIG. 8 shows the embodiment of FIG. 7 but with three analog inputs instead of two.

In some embodiments, the one or more redundant digitized signals are generated from one or more fixed predetermined analog signals of the two or more analog signals (see FIGS. 7-8 and the accompanying discussion). As a result, the phase drift value is generated substantially concurrently with the two or more digitized signals. Alternatively, the one or more redundant digitized signals are cyclically generated from among the two or more analog signals (see FIG. 10 and the accompanying discussion). In this embodiment, two or more phase drift values may be generated substantially concurrently with the two or more digitized signals.

In some embodiments, the two or more analog signals comprise a left analog pickoff signal and a right analog pickoff signal generated by a vibratory flow meter 5. The processing system 330 uses the two or more digitized signals and the phase drift value for determining one or more flow characteristics of a flow material. In some embodiments, the vibratory flow meter 5 comprises a Coriolis mass flow meter 5. The Coriolis mass flow meter 5 generates a mass flow rate measurement from the two or more digitized signals, wherein the two or more digitized signals are received from two or more pickoff sensors.

Figure 4:
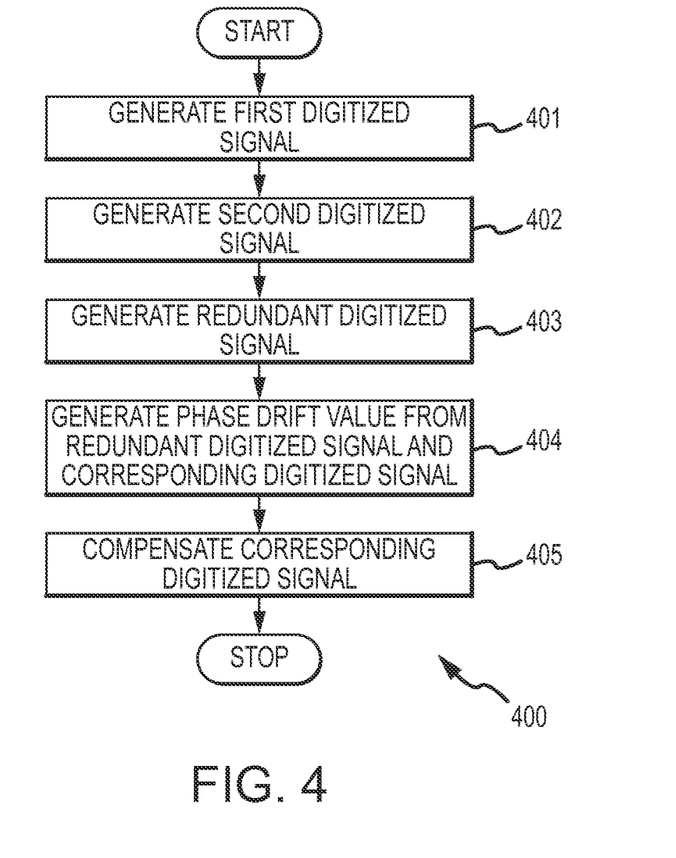
FIG. 4 is a flowchart of a phase synchronization method for digitizing two or more analog signals according to the invention.

FIG. 4 is a flowchart 400 of a phase synchronization method for digitizing two or more analog signals according to the invention. In step 401, a first digitized signal is generated from a first analog signal of the two or more analog signals.

In step 402, at least a second digitized signal is generated from at least a second analog signal of the two or more analog signals. As a result, two or more digitized signals are created. It should be understood that more than two analog signals can be digitized, depending on the number of analog inputs.

In step 403, one or more redundant digitized signals are generated from the two or more analog signals. The number of redundant digitized signals can depend on the number of available ADCs. Further, the number of redundant digitized signals can be a design choice. The one or more redundant digitized signals are generated substantially in parallel with the two or more digitized signals, wherein the one or more redundant digitized signals can be compared to one or more of the digitized signals.

In step 404, a phase drift value is generated. The phase drift value can be generated from a phase difference between a redundant digitized signal of the one or more redundant digitized signals and a corresponding digitized signal of the two or more digitized signals. The phase drift value comprises a quantification of a phase drift of a particular ADC. The phase drift value comprises a quantification of a phase drift between two ADC devices. The phase drift value can subsequently be used for phase synchronization. The phase drift value can be applied to an output of an appropriate ADC.

In step 405, the corresponding digitized signal (i.e., the digitized signal being compared to the redundant digitized signal) is compensated using the phase drift value. The compensation can comprise using the phase drift value in subsequent use or processing of the digitized signal.

In some embodiments, the method provides multiple, substantially parallel redundant signals for use in the synchronization method. In such an embodiment, the method can generate a redundant digitized left pickoff signal from the left analog pickoff signal, generate a redundant digitized right pickoff signal from the right analog pickoff signal, generate a left phase drift value from a left phase difference between the digitized left pickoff signal and the redundant digitized left pickoff signal, generate a right phase drift value from a right phase difference between the digitized right pickoff signal and the redundant digitized right pickoff signal, compensate the left digitized signal using the left phase drift value, and compensate the right digitized signal using the right phase drift value.

In other embodiments, the method provides serial redundant signals for use in the synchronization method. In such an embodiment, the method can generate a redundant digitized left pickoff signal from the left analog pickoff signal, generate a left phase drift value from a left phase difference between the digitized left pickoff signal and the redundant digitized left pickoff signal, compensate the left digitized signal using the left phase drift value, generate a redundant digitized right pickoff signal at a second time from the right analog pickoff signal, generate a right phase drift value at the second time from a right phase difference between the digitized right pickoff signal and the redundant digitized right pickoff signal, and compensate the right digitized signal at the second time using the right phase drift value.

Figure 5:
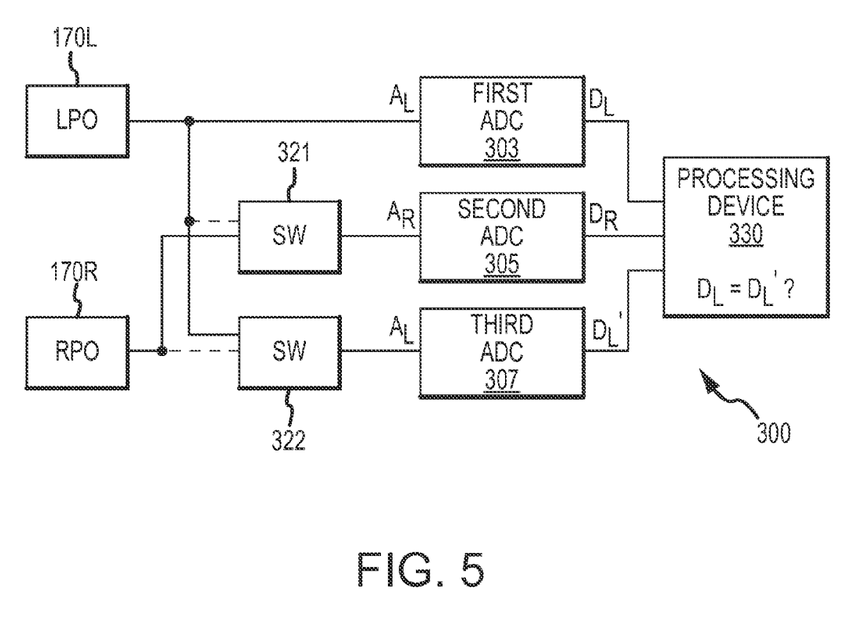
FIG. 5 shows an ADC conversion stage where a first conversion configuration is set by switches.

FIG. 5 shows the ADC conversion stage 300 where a first conversion configuration is set by the switches 321 and 322. As a consequence, the first ADC 303 receives the analog left pickoff signal $A_L$ and generates the digitized left pickoff signal $D_L$ while the third ADC 307 receives the analog left pickoff signal $A_L$ and generates the redundant digitized left pickoff signal $D_L'$. The second ADC 305 receives the analog right pickoff signal $A_R$ and generates the digitized right pickoff signal $D_R$. The redundant digitized left pickoff signal $D_L'$ can then be compared to the digitized left pickoff signal $D_L$ in order to determine phase drift in the first ADC 303.

The digitized left pickoff signal $D_L$ and the digitized redundant left pickoff signal $D_L'$, since they are both produced from the analog left pickoff signal $A_L$, should have an identical phase. Therefore, a phase difference value between these two digitized signals $D_L$ and $D_L'$ will show an amount of relative phase drift between the first ADC 303 and the second ADC 305.

The phase difference value can be used to perform phase compensation or phase adjustment on the first ADC 303, for example. The phase difference value for the first ADC 303 can be used in subsequent processing, wherein the digitized signal from the first ADC 303 can be modified according to the phase difference value. This can include mathematically or numerically modifying the digitized signal using the phase difference value.

This phase difference detection will not require much time and will not interfere with digitization of the two pickoff signals. During this operation, the first ADC 303 will output the digitized left pickoff signal $D_L$ for flow measurement and processing. At the same time, the second ADC 305 will output the digitized right pickoff signal $D_R$, wherein the digitized left and right signals $D_L$ and $D_R$ can be used to calculate various flow characteristics and/or flow material characteristics.

Figure 6:
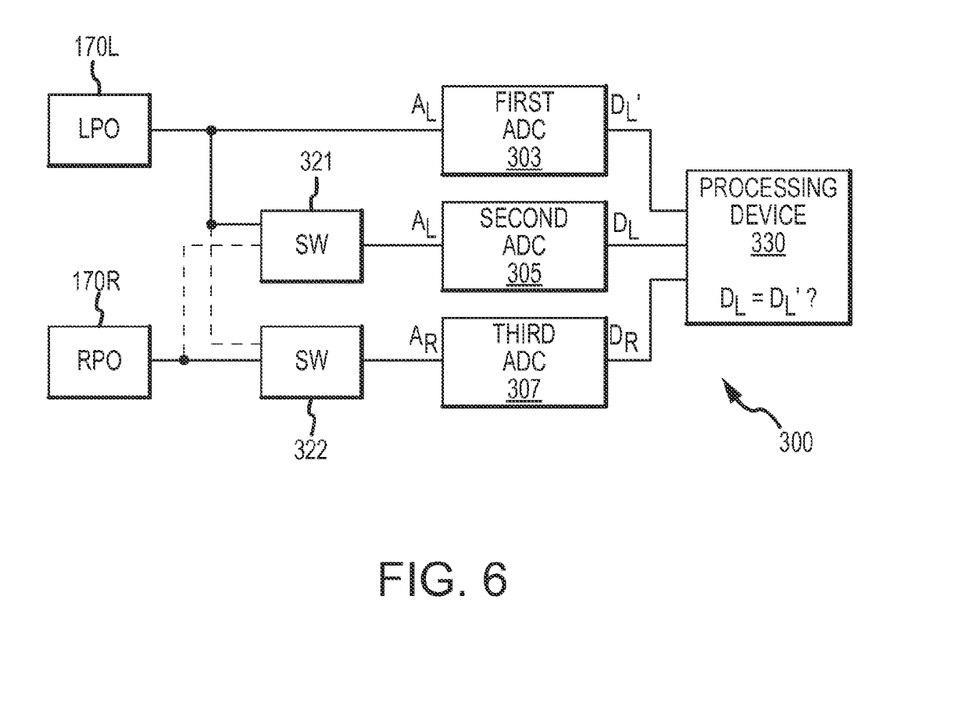
FIG. 6 shows the ADC conversion stage wherein the switches have been changed from the states shown in FIG. 5 and a second conversion configuration is set.

FIG. 6 shows the ADC conversion stage 300 where the switches 321 and 322 have been changed from the states shown in FIG. 5 and a second conversion configuration is set. The first ADC 303 and the second ADC 305 receive the analog left pickoff signal $A_L$ and the third ADC 307 receives the analog right pickoff signal $A_R$. In this configuration, the first ADC 303 produces a redundant digitized left pickoff signal $D_L'$, the third ADC 307 produces a digitized right pickoff signal $D_R$, and the second ADC 305 produces a digitized left pickoff signal $D_L$. A phase difference value between $D_L$ and $D_L'$ can be used to compensate or correct the second ADC 305.

In the embodiment discussed above, the two comparisons are: compare the first ADC to the second ADC and then compare the third ADC to the second ADC. The two steps are then iterated. Alternatively, the phase drift compensation can comprise three or more comparisons, such as, for example and not for limitation: compare the first ADC to the third ADC, compare the first ADC to the second ADC, and then compare the second ADC to the third ADC. The three steps are then iterated.

Because there are two or more inputs, three or more possible outputs (such as the set $A_L, A_R, A_L'$ or the set $A_L, A_R, A_L'$, $A_R'$, for example), and multiple ADC devices, the result is that many combinations of ADCs and outputs is possible. It should be understood that not all possible combinations are necessary in order to monitor phase drift in a set of three ADCs. A simplest algorithm would be to use one of the three ADCs only for phase drift detection, such as the second ADC 305 (see FIG. 7 and the accompanying discussion). However, any arrangement can be used, as is seen from the various figures.

FIG. 7 shows the ADC stage 300 according to another embodiment of the invention. In this embodiment, the first ADC 303 generates the digitized left signal $D_L$ and the third ADC 307 generates the digitized right signal $D_R$, while the second ADC 305 is dedicated to producing redundant digitized signals. Consequently, only a single switch 320 is needed.

In operation, the switch 320 provides either the left analog signal $A_L$ or the right analog signal $A_R$ to the second ADC 305. The second ADC 305 generates either a redundant digitized left signal $D_L'$ or a redundant digitized right signal $D_R'$, based on the signal provided from the switch 320. The second ADC 305 functions as a reference device and does not generate a measurement or working output in this embodiment.

It can be seen that the phase drift measurement is serial in nature in this embodiment. A left signal phase drift is quantified, then a right signal phase drift, then back to the left signal. The embodiment is simple and may provide adequate phase drift quantification for all but the highest sampling rates or most extreme operating conditions.

FIG. 8 shows the embodiment of FIG. 7 but with three analog inputs instead of two. As before, the second ADC 305 can cyclically receive one of the three inputs and generate corresponding redundant digitized outputs for phase drift quantification and compensation.

Figure 9:
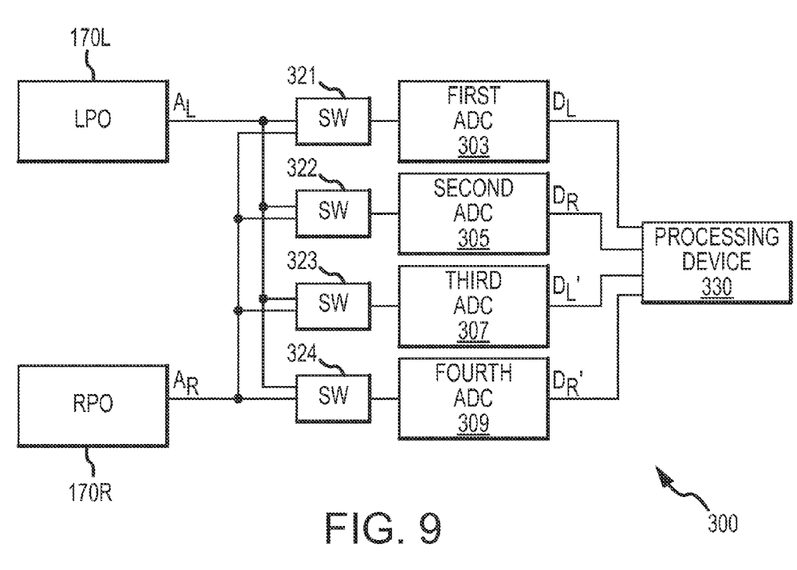
FIG. 9 shows the ADC stage according to another embodiment of the invention.

FIG. 9 shows the ADC stage 300 according to another embodiment of the invention. In this embodiment, the ADC stage 300 includes two analog inputs and four ADCs 303, 3054, 307, and 309. Consequently, the ADC stage 300 can generate redundant digitized signals in parallel. The phase drift compensation in this embodiment may therefore track phase drift more closely and with less probability of delay.

The four ADC embodiment in this figure may take advantage of commercially available codecs having two ADC devices per chip. Rather that using only a single ADC device for phase drift determination and leaving one ADC unused, with two ADCs being used for signal digitization, all four ADCs can be employed, according to any desired operational pattern.

The ADC stage 300 in the figure may implement a phase drift determination in different ways. In one operational method, two of the four ADCs can be dedicated to generating the two digitized output signals and the remaining two ADCs can be dedicated to generating the two redundant digitized signals, as shown in the figure.

In another operational method, the ADCs can be controlled to cycle and alternatingly generate digitized and redundant digitized signals. In this embodiment, none of the ADCs function as fixed references and may minimize errors if a particular ADC is defective or exhibits excessive phase drift (see FIG. 10 and the accompanying discussion).

Figure 10:
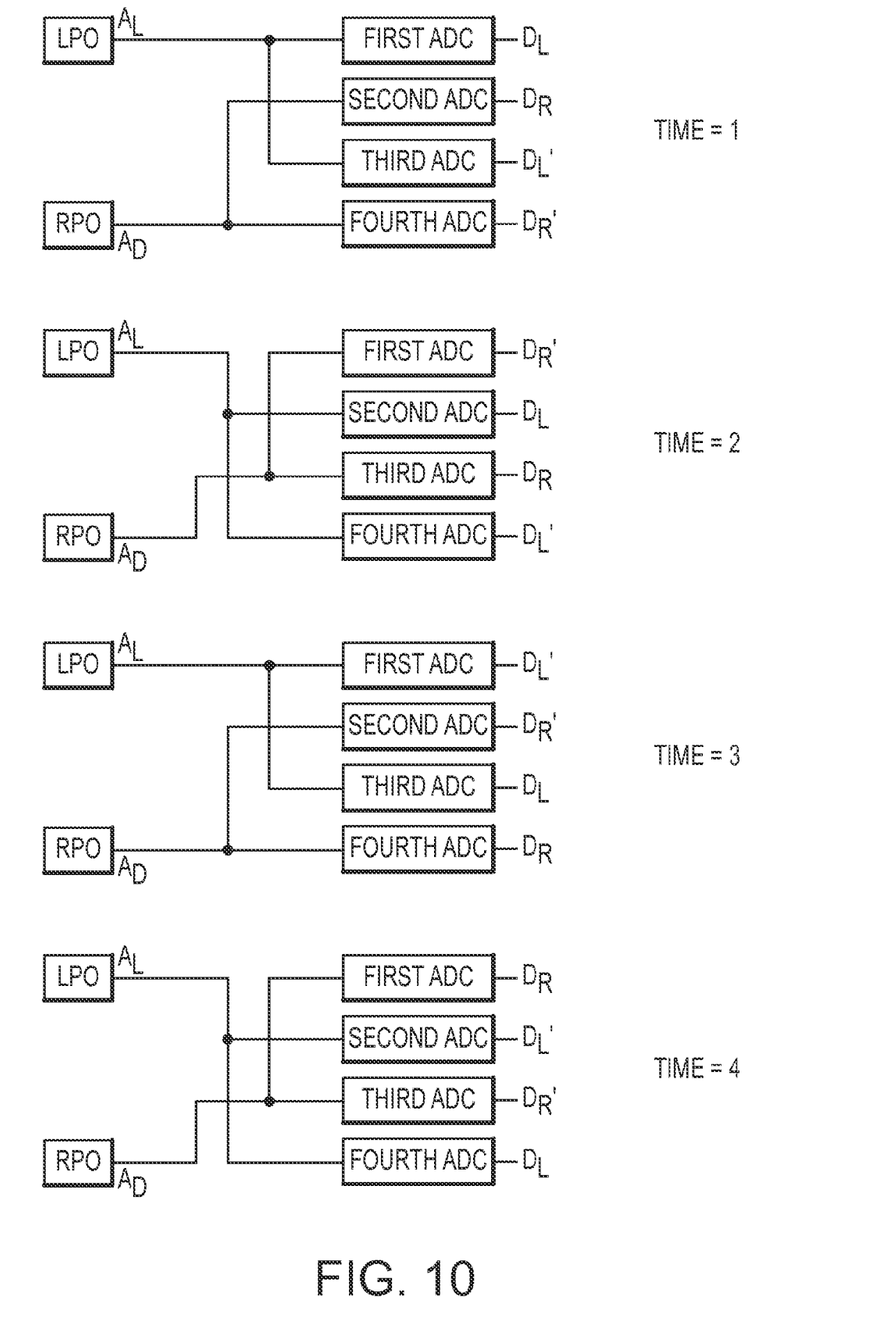
FIG. 10 shows the ADC stage of FIG. 9 when operated in a cyclic manner over four discrete time periods.

FIG. 10 shows the ADC stage 300 of FIG. 9 when operated in a cyclic manner over four discrete time periods. In this operational embodiment, each ADC will generate the digitized and redundant digitized outputs ($D_L$, $D_R$, $D_L'$, $D_R'$). At the end of the fourth period, the operation will iteratively loop back and perform the operation again.

What is claimed is:

1. An analog-to-digital conversion (ADC) stage (300) for digitizing two or more analog signals, the ADC stage (300) comprising:
    four or more ADCs (303, 305, 307, 309) configured to receive the two or more analog signals, generate a first digitized signal from a first analog signal of the two or more analog signals, generate at least a second digitized signal from at least a second analog signal of the two or more analog signals to create two or more digitized signals, generate a first redundant digitized signal from the first analog signal, and generate a second redundant digitized signal from the second analog signal, with the first and second redundant digitized signals being generated substantially in parallel with the two or more digitized signals;
    a processing device (330) coupled to the four or more ADCs (303, 305, 307, 309), with the processing device (330) configured to generate first and second phase drift values from phase differences between the first and second redundant digitized signals and the two or more digitized signals and compensate the two or more digitized signals using the first and second phase drift values.

2. The ADC stage (300) of claim 1, with the two or more analog signals comprising a left analog pickoff signal and a right analog pickoff signal generated by a vibratory flow meter, with generating the first and second redundant digitized signals, generating the first and second phase drift values, and compensating the corresponding digitized signals further comprising:
    generating a left phase drift value from a left phase difference between the digitized left pickoff signal and the first redundant digitized signal;
    generating a right phase drift value from a right phase difference between the digitized right pickoff signal and the second redundant digitized signal;
    compensating the left digitized signal using the left phase drift value; and
    compensating the right digitized signal using the right phase drift value.

3. The ADC stage (300) of claim 1, wherein the first and second phase drift values are generated substantially concurrently with the two or more digitized signals.

4. The ADC stage (300) of claim 1, with the two or more analog signals comprising a left analog pickoff signal and a right analog pickoff signal generated by a vibratory flow meter.

5. The ADC stage (300) of claim 1, with the two or more analog signals comprising a left analog pickoff signal and a right analog pickoff signal generated by a vibratory flow meter, with the processing system (330) using the two or more digitized signals and the first and second phase drift values for determining one or more flow characteristics of a flow material.

6. The ADC stage (300) of claim 1, with the two or more analog signals comprising a left analog pickoff signal and a right analog pickoff signal generated by a Coriolis mass flow meter, with the processing system (330) using the two or more digitized signals and the first and second phase drift values for determining one or more flow characteristics of a flow material.

7. A phase synchronization method for digitizing two or more analog signals, the method comprising:
   generating a first digitized signal from a first analog signal of the two or more analog signals and generating at least a second digitized signal from at least a second analog signal of the two or more analog signals to create two or more digitized signals;
   generating first and second redundant digitized signals from the two or more analog signals, with the first and second redundant digitized signals being generated substantially in parallel with the two or more digitized signals;
   generating first and second phase drift values from phase differences between the first and second redundant digitized signals and the two or more digitized signals; and
   compensating the two or more digitized signals using the first and second phase drift values.

8. The phase synchronization method of claim 7, wherein the first and second phase drift values are generated substantially concurrently with the two or more digitized signals.

9. The phase synchronization method of claim 7, with the two or more analog signals comprising a left analog pickoff signal and a right analog pickoff signal generated by a vibratory flow meter.

10. The phase synchronization method of claim 7, with the two or more analog signals comprising a left analog pickoff signal and a right analog pickoff signal generated by a vibratory flow meter, with the method further comprising using the two or more digitized signals and the first and second phase drift values for determining one or more flow characteristics of a flow material.

11. The phase synchronization method of claim 7, with the two or more analog signals comprising a left analog pickoff signal and a right analog pickoff signal generated by a Coriolis mass flow meter, with the method further comprising using the two or more digitized signals and the first and second phase drift values for determining one or more flow characteristics of a flow material.

12. The phase synchronization method of claim 7, with the two or more analog signals comprising a left analog pickoff signal and a right analog pickoff signal generated by a vibratory flow meter, with the steps of generating the first and second redundant digitized signals, generating the first and second phase drift values, and compensating the corresponding digitized signals further comprising:
   generating a left phase drift value from a left phase difference between the digitized left pickoff signal and the first redundant digitized signal;
   generating a right phase drift value from a right phase difference between the digitized right pickoff signal and the second redundant digitized signal;
   compensating the left digitized signal using the left phase drift value; and
   compensating the right digitized signal using the right phase drift value.

* * * * *